United States Patent [19]
Shishiguchi et al.

[11] Patent Number: 6,017,823
[45] Date of Patent: Jan. 25, 2000

[54] METHOD OF FORMING A MOS FIELD EFFECT TRANSISTOR WITH IMPROVED GATE SIDE WALL INSULATION FILMS

[75] Inventors: Seiichi Shishiguchi; Tomoko Yasunaga; Akira Mineji, all of Tokyo, Japan

[73] Assignee: NEC Corporation, Tokyo, Japan

[21] Appl. No.: 08/998,626

[22] Filed: Dec. 29, 1997

[30] Foreign Application Priority Data

Dec. 27, 1996 [JP] Japan .................................. 8-351130
Apr. 15, 1997 [JP] Japan .................................. 9-097321

[51] Int. Cl.[7] .................. H01L 21/8238; H01L 21/3205; H01L 21/4763; H01L 21/44; H01L 21/311
[52] U.S. Cl. ........................ 438/696; 438/230; 438/595; 438/703; 438/683
[58] Field of Search ................ 438/219, 230, 438/591, 595, 696, 703, 791, 682, 683, 787, 970

[56] References Cited

U.S. PATENT DOCUMENTS 5,661,052  8/1997  Inoue ........................................ 438/303
5,759,899  6/1998  Saito ......................................... 438/303

Primary Examiner—Chandra Chaudhari
Assistant Examiner—Nema Berezny
Attorney, Agent, or Firm—Young & Thompson

[57] ABSTRACT

The present invention provides a method of forming gate side wall insulation films on side walls of a gate electrode on a gate insulation film over a silicon substrate surface. The method comprises The following steps. Gate side wall insulation films are selectively formed on side walls of a gate electrode. A silicon film is selectively grown on at least any one of a top of the gate electrode and on the silicon substrate surface. Surface regions of the gate side wall insulation films are etched.

11 Claims, 13 Drawing Sheets

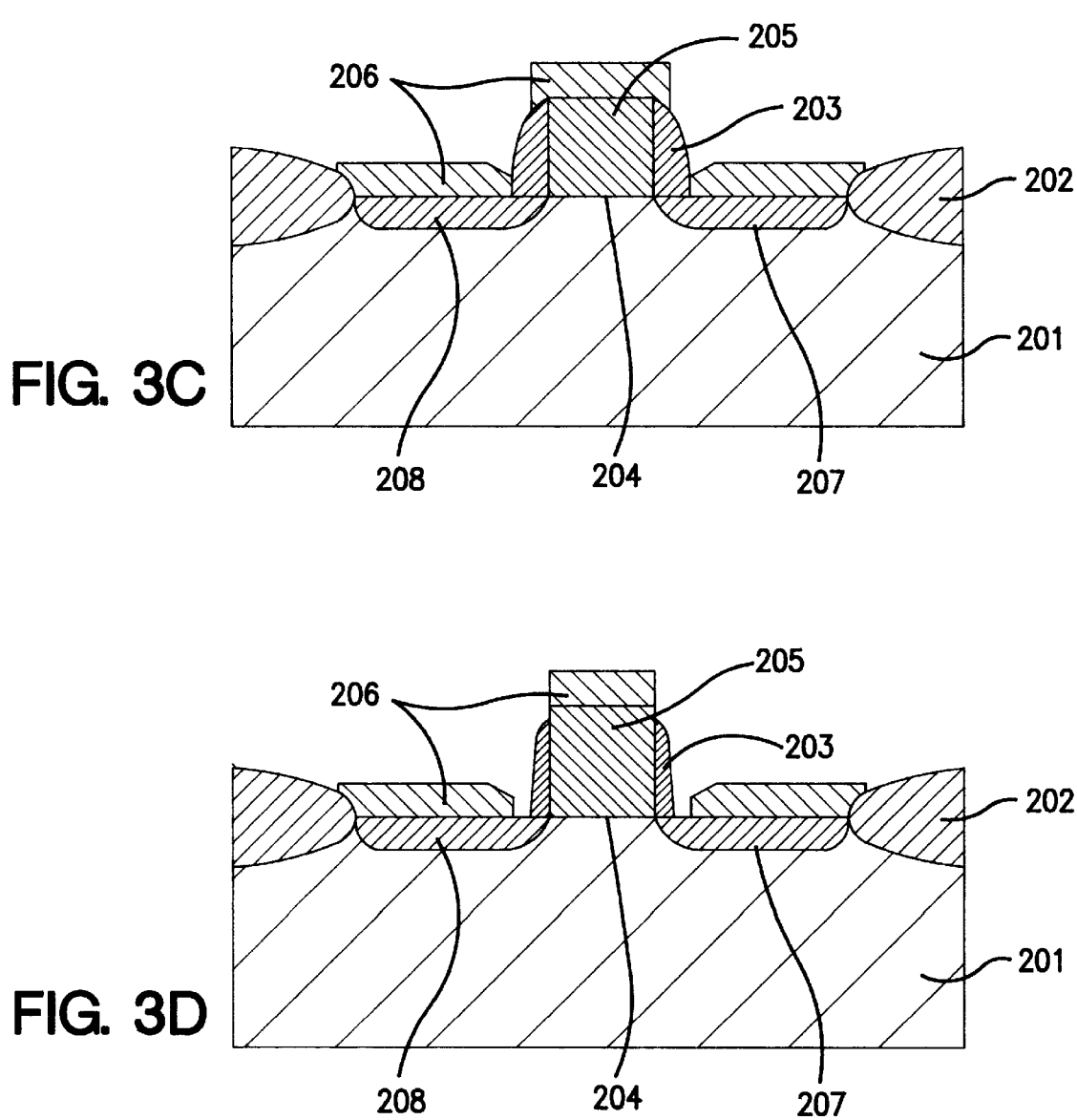

METHOD OF FORMING A MOS FIELD EFFECT TRANSISTOR WITH IMPROVED GATE SIDE WALL INSULATION FILMS

BACKGROUND OF THE INVENTION

The present invention relates to a method of forming a semiconductor device, and more particularly to a method of forming a MOS field effect transistor with gate side wall oxide films.

For high density integration of semiconductor devices, a scaling down of individual elements has progressed. MOS field effect transistors are also required to be scaled down. However, the scaling down of MOS field effect transistors causes short channel effects. It has been proposed to form shallow source/drain diffusion regions so as to suppress the short channel effects. This method of forming the shallow source/drain diffusion regions causes other problems with the increase in sheet resistance and also with the increase in the contact resistance between the diffusion layers and interconnections.

It had also been proposed that in order to solve the above problems, selective growth of silicon films on the source/drain diffusion regions and the gate electrode, along with optional silicidations of the selectively grown silicon films could be made. This method is disclosed in the Japanese laid-open patent publication No. 2-84740. This method allows both the formation of the shallow source/drain diffusion regions and the reduction in contact resistances. This method of forming a MOS field effect transistor will be described with reference to FIGS. 1A through 1D which are fragmentary cross sectional elevation views illustrative of MOS field effect transistors in sequential steps involved in the conventional method.

With reference to FIG. 1A, field oxide films 602 are selectively formed on a top surface of a silicon substrate 601. A gate oxide film 604 is formed on the top surface of the silicon substrate 601. A gate electrode 605 is formed on the gate oxide film 604. Gate side wall silicon oxide films 603 are selectively formed on side walls of the gate electrode 605.

With reference to FIG. 1B, silicon films 606 are selectively grown on the silicon substrate 601 and on the gate electrode 605 Source and drain regions 607 and 608 are then formed.

With reference to FIG. 1C, a titanium film 609 is entirely deposited which extends over the field oxide films 602, the selectively grown silicon films 606 and the gate side wall silicon oxide films 603. The substrate is then subjected to an annealing at a predetermined temperature so as to cause a silicidation reaction of titanium with silicon thereby to selectively form titanium silicide films 610 over the selectively grown silicon films 606 (FIG. 10).

As another conventional method, it had also been proposed that silicon nitride films having a lower etching rate are formed as side walls of the gate oxide films before an epitaxial growth of silicon so as to prevent bottoms of the gate side walls from etching in a process previous to the selective growth of silicon whereby any short circuit formation may be prevented. This conventional method is disclosed in the Japanese laid-open patent publication no. 63-166271.

In the above conventional methods, the silicon films are grown up over the source and drain regions and the gate electrode concurrently. The selective growth process of silicon may, however, have a possibility of undesired deposition of silicon over the insulation films such as the gate side wall insulation films. If the silicon crystal particles are grown on the gate side wall insulation films, then this forms an electrical connection via the silicon crystal particles between the gate electrode and either the source or drain region whereby a short circuit is formed between the gate electrode and either the source or drain region. If particularly thick silicon films are selectively grown, then an effective distance between the gate electrode and either the source or drain region is short. For this reason, small size silicon crystal particle growth on the gate side wall insulation films may form the short circuit. The formation of the short circuit allows a leakage of current between the gate electrode and either the source or drain region.

It had also been proposed to increase the thickness of the gate side wall insulation films in order to avoid the formation of the short circuit between the gate electrode and the either source or drain region. It is however, difficult to form the source and drain regions by ion-implantation through the thick gate side wall insulation films into the silicon substrate. It is possible that the ion is not implanted into the silicon regions under the gate side wall insulation films.

In the above circumstances, it had been required to develop a novel method of forming a MOS field effect transistor with gate side wall insulation films free from the above problems.

SUMMARY OF THE INVENTION

Accordingly, it is an object of the present invention to provide a novel method of forming a MOS field effect transistor with gate side wall insulation films free from the above problems.

It is a further object of the present invention to provide a novel method of forming a MOS field effect transistor with gate side wall insulation films free of any leakage of current between a gate electrode and either source or drain region.

It is a still further object of the present invention to provide a novel method of forming a MOS field effect transistor with gate side wall insulation films free of any short circuit formation between a gate electrode and either source or drain region.

It is yet a further object of the present invention to provide a novel method of forming a MOS field effect transistor with gate side wall insulation films at a high yield.

It is a further more object of the present invention to provide a novel method of forming a MOS field effect transistor with gate side wall insulation films with a high reliability.

It is still more object of the present invention to provide a novel method of forming a MOS field effect transistor with gate side wall insulation films with shallow impurity introduced regions directly under the gate side wall insulation films.

It is moreover object of the present invention to provide a novel method of forming a MOS field effect transistor with gate side wall insulation films with an improved driving current characteristic.

The above and other objects, features and advantages of the present invention will be apparent from the following descriptions.

The present invention provides a method of forming gate side wall insulation films on side walls of a gate electrode on a gate insulation film over a silicon substrate surface. The method comprises the following steps. Gate side wall insulation films are selectively formed on side walls of a gate electrode. A silicon film is selectively grown on at least any one of a top of the gate electrode and on the silicon substrate surface. Surface regions of the gate side wall insulation films are etched.

It is preferable to further form secondary gate side wall insulation films on the etched surfaces of the gate side wall insulation films.

It is also preferable that the gate side wall insulation films comprise silicon oxide films and wherein surface regions of the silicon oxide films are etched.

It is preferable to further form secondary silicon oxide films on the etched surfaces of the silicon oxide films.

It is also preferable that the gate side wall insulation films comprise laminations of silicon nitride films and silicon oxide films laminated on the silicon nitride films and wherein the silicon oxide films are etched whilst the silicon nitride films remain unetched.

It is preferable to further form secondary silicon oxide films on the remaining silicon nitride films.

It is also preferable that the surface regions of the gate side wall insulation films are etched by a wet etching. The wet etching may be carried out using a diluted HF solution.

BRIEF DESCRIPTION OF THE DRAWINGS

Preferred embodiments according to the present invention will be described in detail with reference to the accompanying drawings.

FIGS. 3A through 3G are fragmentary cross sectional elevation views illustrative of MOS field effect transistors with gate side wall oxide films in sequential steps involved in a first embodiment according to the present invention.

DESCRIPTION OF PREFERRED EMBODIMENTS

A first feature of the present invention will be described in detail with reference to FIGS. 2A through 2G which are fragmentary cross sectional elevation views illustrative of MOS field effect transistors with gate side wall oxide films in sequential steps of fabrication.

Figure 1A:
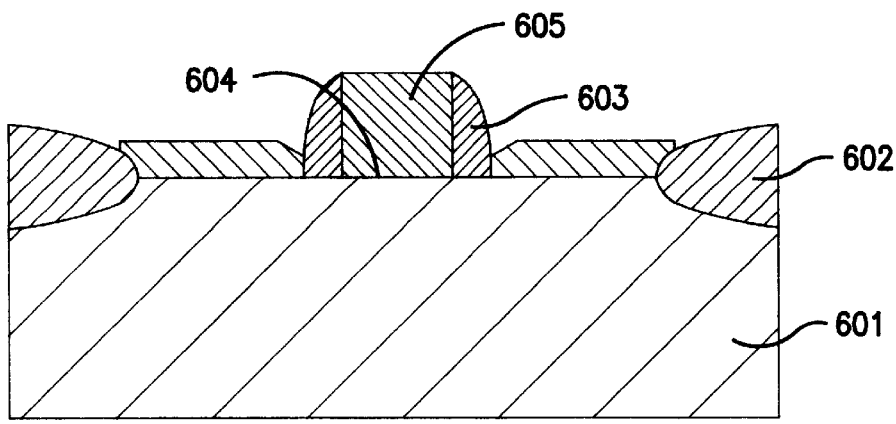
FIGS. 1A through 1D are fragmentary cross sectional elevation views illustrative of MOS field effect transistors with gate side wall oxide films in sequential steps involved in the conventional method.
Figure 1B:
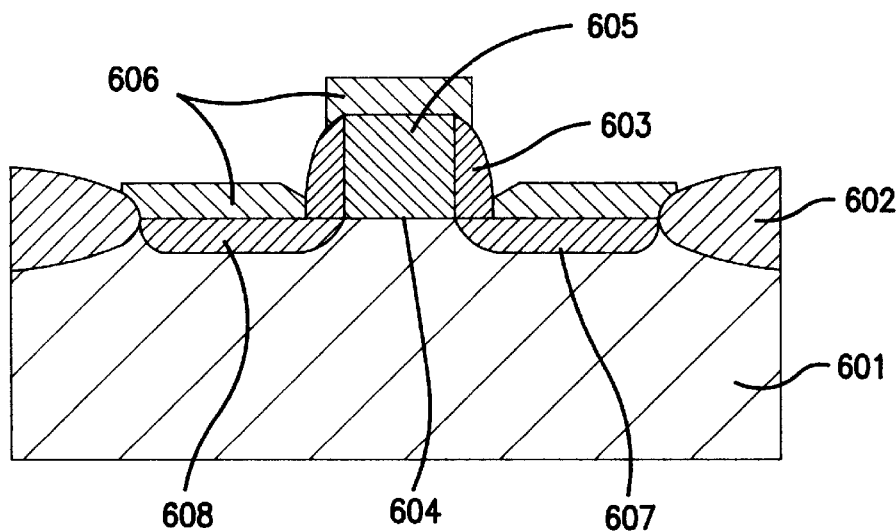
Figure 1C:
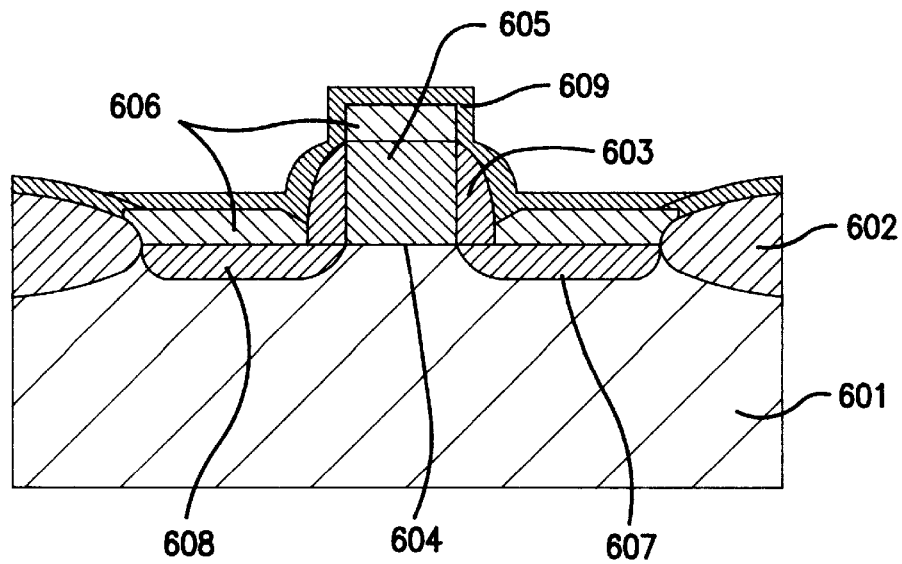
Figure 1D:
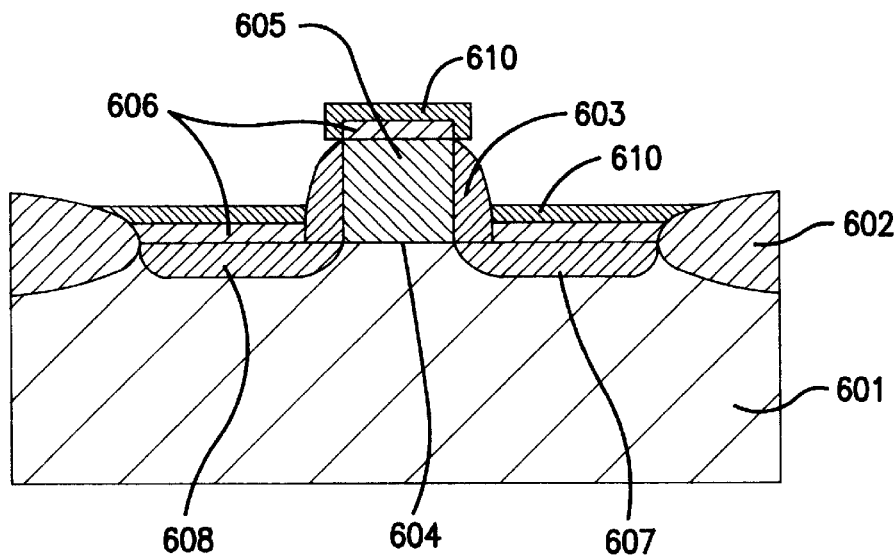
Figure 2A:
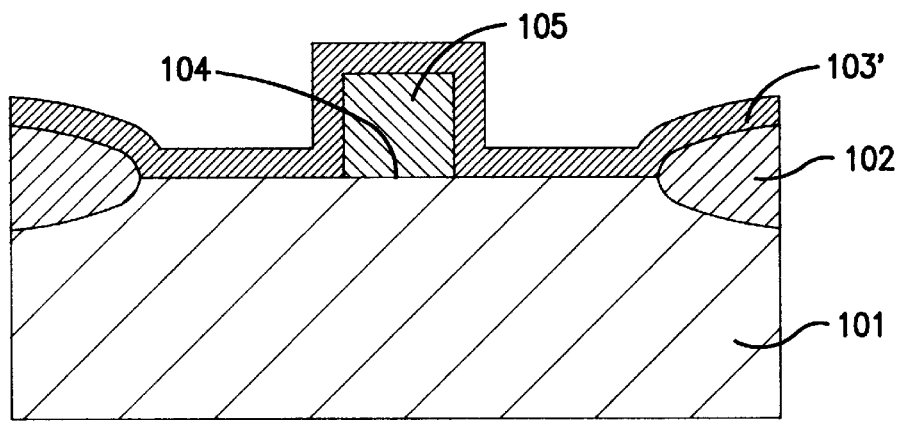
FIGS. 2A through 2G are fragmentary cross sectional elevation views illustrative of MOS field effect transistors with gate side wall oxide films in sequential steps involved according to the first present invention.

With reference to FIG. 2A, field oxide films 102 are selectively formed by a local oxidation of silicon method on a top surface of a silicon substrate 101. A gate oxide film 104 is formed on the top surface of the silicon substrate 101. A polysilicon film is deposited over the gate oxide film 104 and over the field oxide films 102. The polysilicon film is then patterned by a photolithographic technique to form a gate oxide film 104 and a gate electrode 105. A silicon oxide film 105' as then deposited over the gate electrode 105, the silicon substrate 101 and the field oxide films 102.

Figure 2B:
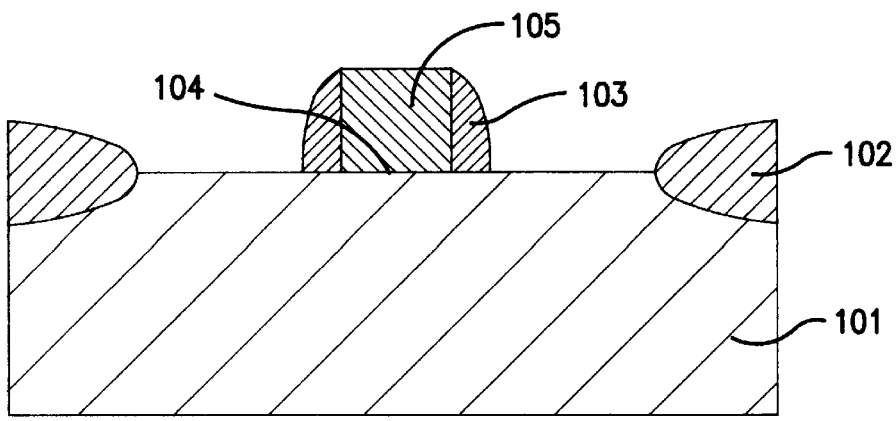
Figure 2C:
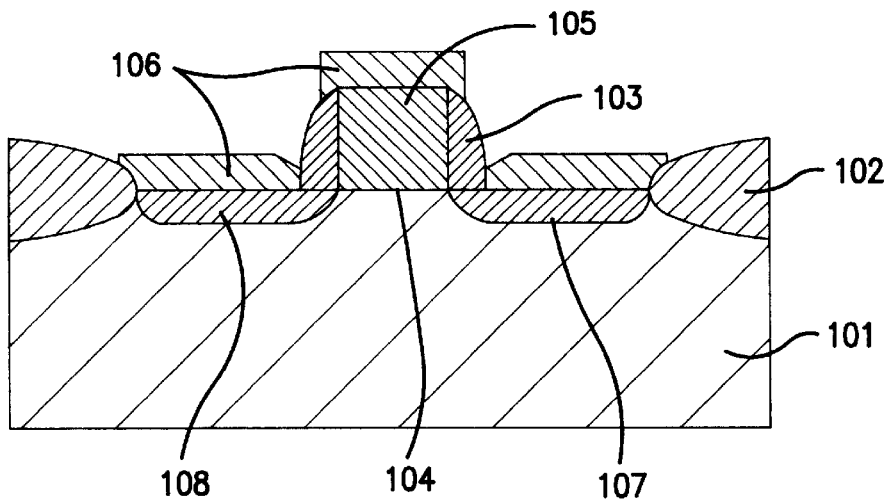

With reference to FIG. 2B, the silicon oxide film 103' is subjected to an etch back process to form gate side wall silicon oxide films 103. With reference to FIG. 2C, silicon films 106 are selectively grown on the silicon substrate 101 and on the gate electrode 105. Thereafter, the substrate is subjected to an ion-implantation for subsequent annealing to activate the implanted ions thereby forming source and drain regions 108 and 107.

Figure 2D:
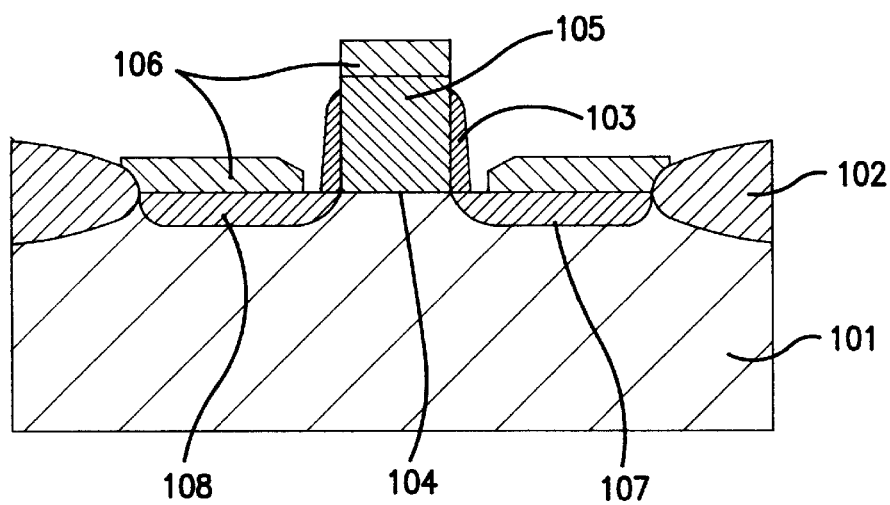

With reference to FIG. 2D, the substrate is then subjected to a wet etching to remove surface regions of the gate side wall silicon oxide films 103 whereby the thickness of the gate side wall silicon oxide films 103 is reduced.

Figure 2E:
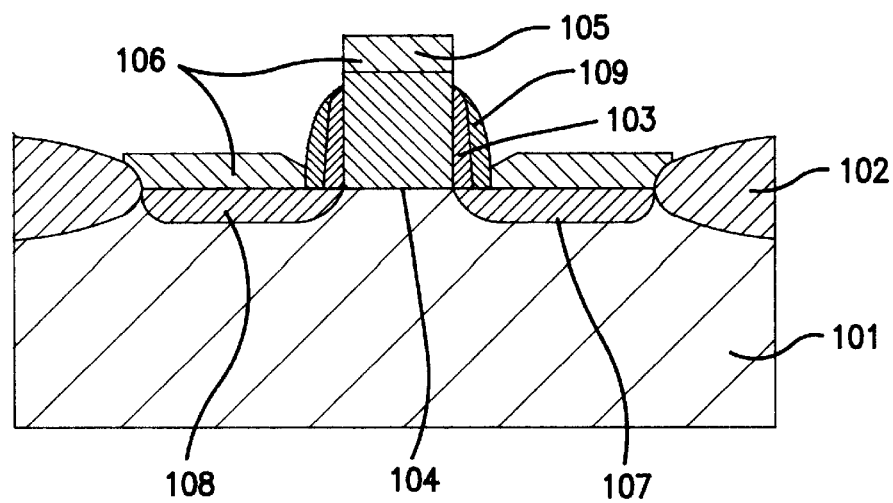

With reference to FIG. 2E, a silicon oxide film is deposited for subsequent etch back process to form secondary gate side wall silicon oxide films 109 on the gate side wall silicon oxide films 103.

Figure 2F:
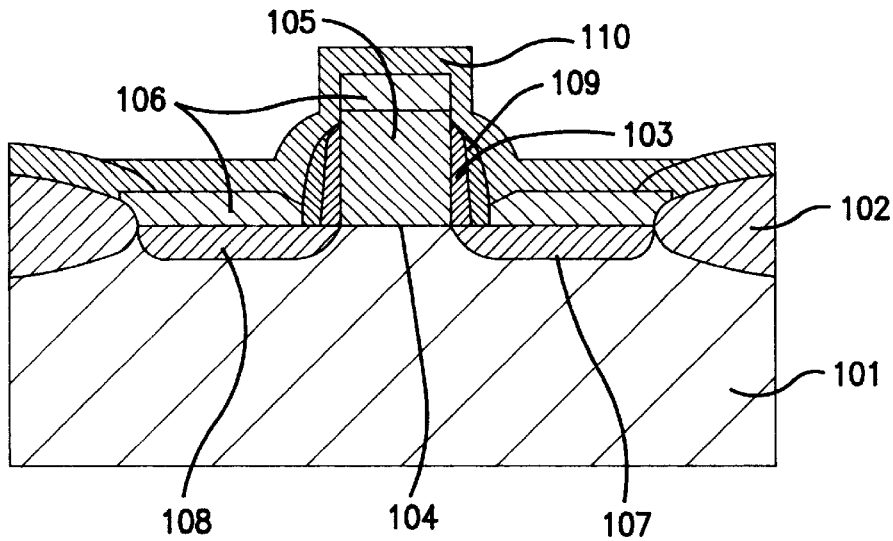

With reference to FIG. 2F, a metal film 110 is then deposited by a sputtering method.

Figure 2G:
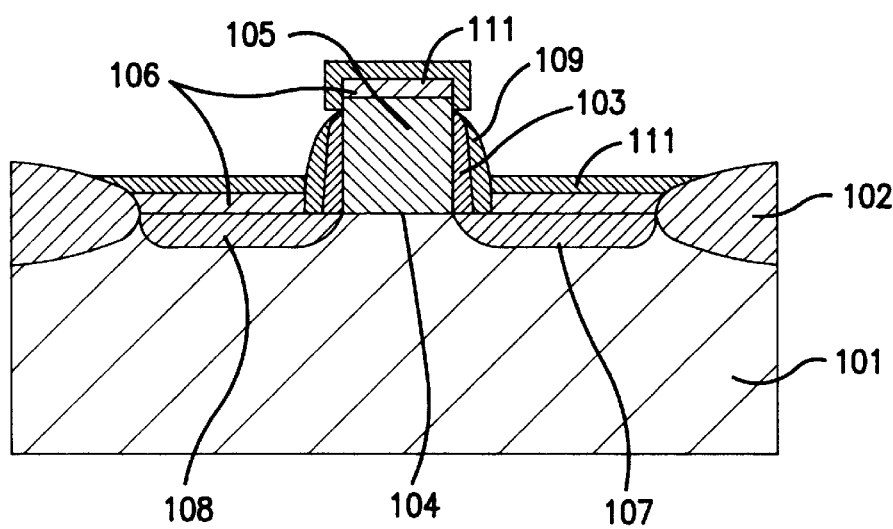

With reference to FIG. 2G, the substrate is then subjected to an annealing to cause a metal silicidation reaction to selectively form metal silicide films 111 on the selectively grown silicon films 106. Unreacted titanium film 110 is then removed An inter-layer insulator and an interconnection are formed by the known processes thereby forming a MOS field effect transistor.

In the above novel method, after the gate side wall insulation films have been formed, then the silicon films are selectively grown on the silicon substrate and on the gate electrode. It is, however, possible that silicon crystal particles are formed on the gate side wall insulation films. As described above, however, the surface regions of the gate side wall insulation films are etched by a wet etching thereby any silicon crystal particles are also removed. As a result, the surfaces of the gate side wall insulation films have no silicon crystal particle. For this reason, it is possible to prevent any formation of a short circuit between the gate electrode and either the source or drain region whereby no leakage of current between the gate electrode and either the source or drain region may appear.

Whereas in this embodiment, the novel method is applied to the formation of the p-MOS field effect transistor, the novel method may of course be applied to other MOS field effect transistor of field n-MOS or CMOS type.

As the metal silicide film, preferably refractory metal silicide films such as titanium silicide films, tungsten silicide film, cobalt silicide film and molybdenum silicide film are also available.

Further, in place of the ultrahigh vacuum chemical vapor deposition system, a low pressure chemical vapor deposition system is also available.

A second feature of the present invention will be described in detail with reference to FIGS. 4A through 4F which show fragmentary cross sectional elevation views illustrative of MOS field effect transistors with gate side wall oxide films in sequential steps of fabrication.

Figure 4A:
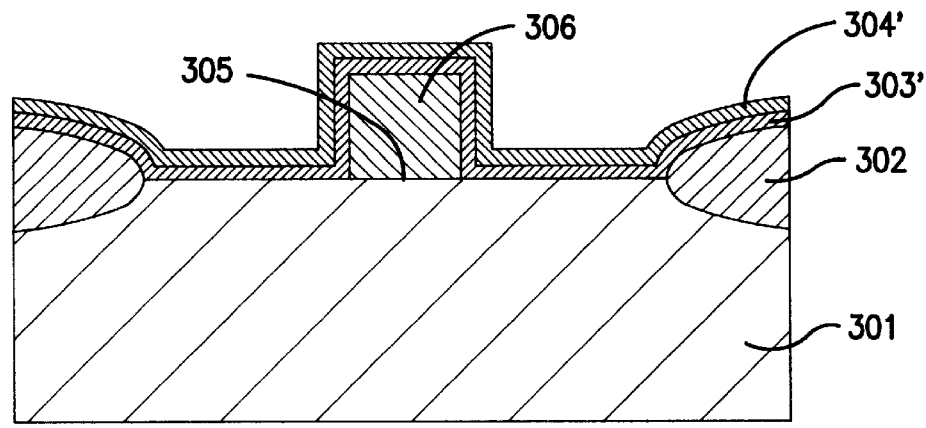
FIGS. 4A through 4F are fragmentary cross sectional elevation views illustrative of MOS field effect transistors with gate side wall oxide films in sequential steps involved according to the second present invention.

With reference to FIG. 4A, field oxide films 302 are selectively formed by a local oxidation of silicon method on a top surface of a silicon substrate 301. A gate oxide film 305 is formed on the fop surface of the n-silicon substrate 301. A polysilicon film is deposited over the gate oxide film 305 and over the field oxide films 302. The polysilicon film is then patterned to form a gate oxide film 305 and a gate electrode 306. A silicon nitride film 303' is then deposited over the gate electrode 306, the silicon substrate 301 and the field oxide films 302. Subsequently, a silicon oxide film 304' is then deposited over the silicon nitride film 303'.

Figure 4B:
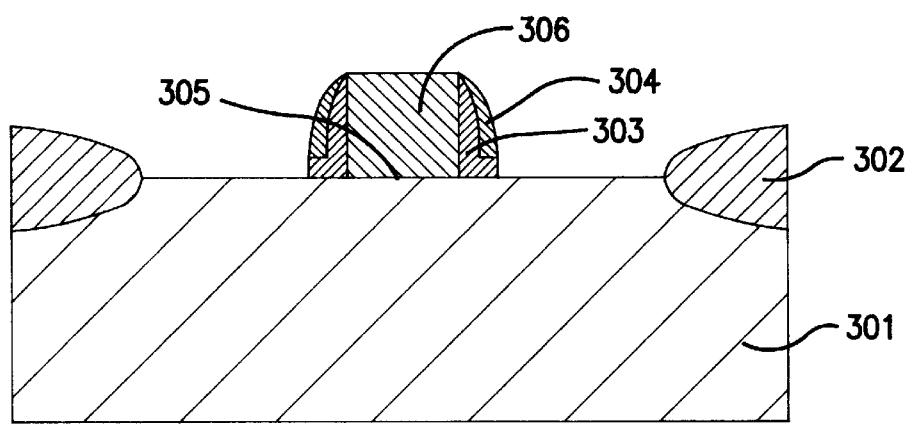

With reference to FIG. 4B, laminations of the silicon nitride film 303' and the silicon oxide film 304' are subjected to an etch back process to form gate side wall silicon nitride film 303 and gate side wall silicon oxide film 304.

Figure 4C:
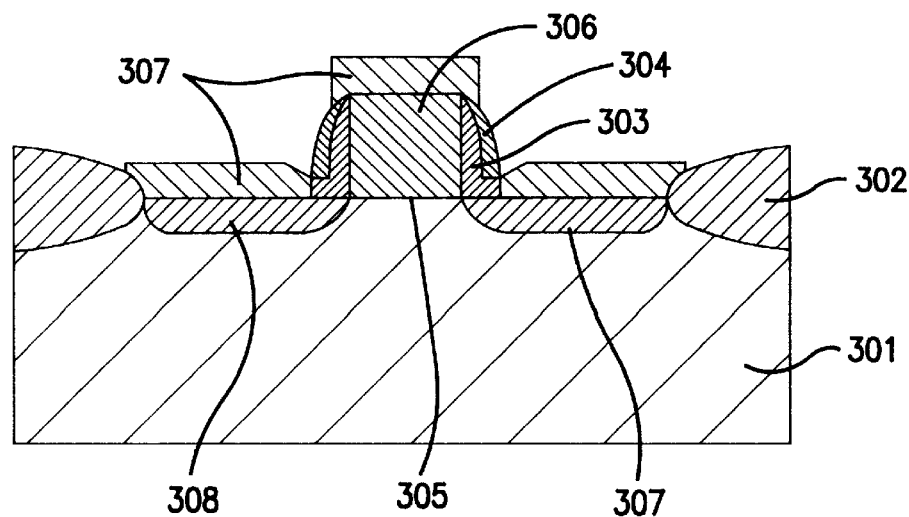

With reference to FIG. 4C, silicon films 307 are selectively grown on the silicon substrate 301 and on the gate electrode 306. Thereafter, the substrate is subjected to an ion-implantation for subsequent annealing to activate the implanted ions thereby forming source and drain regions 309 and 308.

Figure 4D:
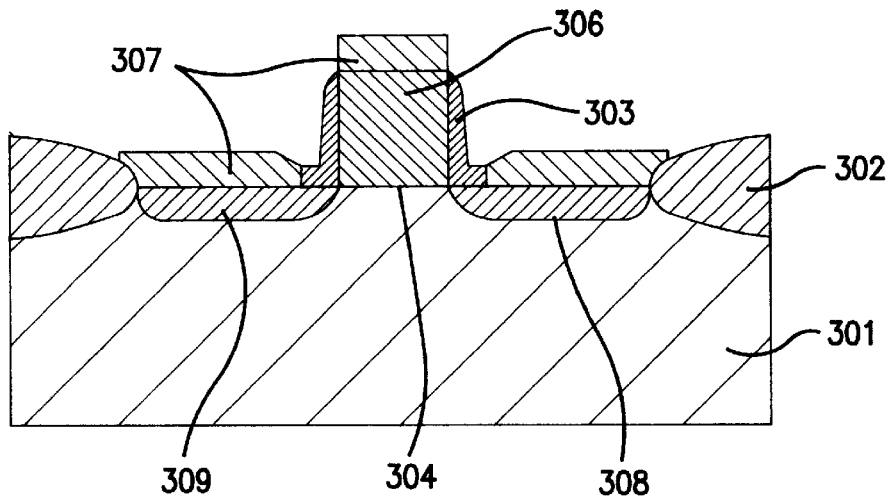

With reference to FIG. 4D, the substrate is then subjected to a wet etching to remove the gate side wall silicon oxide films 304 and to leave the silicon nitride film 303 whereby the thickness of the gate side wall is reduced.

The gate side wall insulation film initially comprises the silicon oxide film 304 laminated over the silicon nitride film 303 so that only the silicon oxide film 304 is etched by the diluted HF solution which is capable of etching the silicon oxide film but incapable of etching the silicon nitride film. For this reason only the silicon oxide film 304 is etched whilst the silicon nitride film 303 remains unremoved. This makes it easy to do highly accurate control of the thickness of the gate side wall insulation films.

Figure 4E:
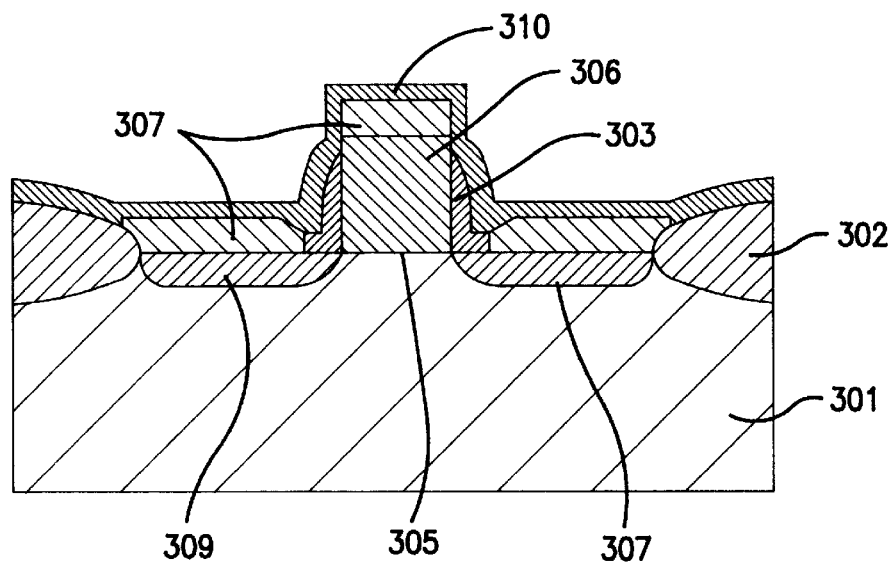

With reference to FIG. 4E, a metal film 310 is then deposited by a sputtering method.

Figure 4F:
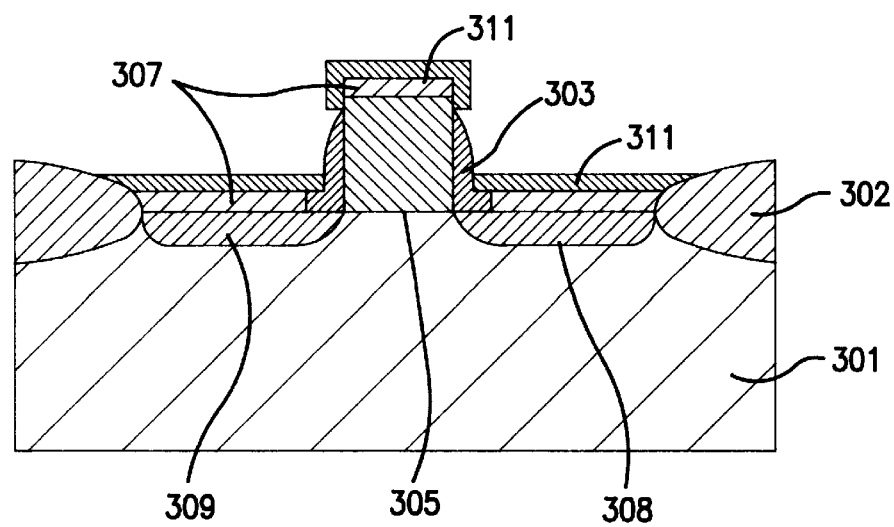

With reference to FIG. 4F, the substrate is then subjected to an annealing to cause a metal silicidation reaction to selectively form metal silicide films 311 on the selectively grown silicon films 307. Unreacted titanium film 310 is then removed. An inter-layer insulator and an interconnection are formed by the known processes thereby forming a MOS field effect transistor.

In the above novel method, after the gate side wall insulation films have been formed, then the silicon films are selectively grown on the silicon substrate and on the gate electrode. It is, however possible that silicon crystal particles are formed on the gate side wall insulation films. As described above, however, the surface regions of the gate side wall insulation films are etched by a wet etching thereby any silicon crystal particles are also removed. As a result, the surfaces of the gate side wall insulation films have no silicon crystal particle. For this reason, it is possible to prevent any formation of a short circuit between the gate electrode and either the source or drain region whereby no leakage of current between the gate electrode and either the source or drain region may appear.

Further, the gate side wall insulation film comprises the silicon oxide film laminated over the silicon nitride film so that only the silicon oxide film is etched, thereby removing any silicon crystal particles. This etching is made using a diluted HF solution as previously discussed.

Whereas in this embodiment, the novel method is applied to the formation of the p-MOS field effect transistor, the novel method may of course be applied to other MOS field effect transistors of either n-MOS or CMOS field type.

As the metal silicide, preferably refractory metal silicide films such as titanium silicide film, tungsten silicide film, cobalt silicide film and molybdenum silicide film are also available.

Further, in place of the ultrahigh vacuum chemical vapor deposition system, a low pressure chemical vapor deposition system is also available.

A first embodiment according to the present invention will be described in detail with reference to FIGS. 3A through 3G which show fragmentary cross sectional elevation views illustrative of MOS field effect transistors with gate side wall oxide films in sequential steps of fabrication.

Figure 3A:
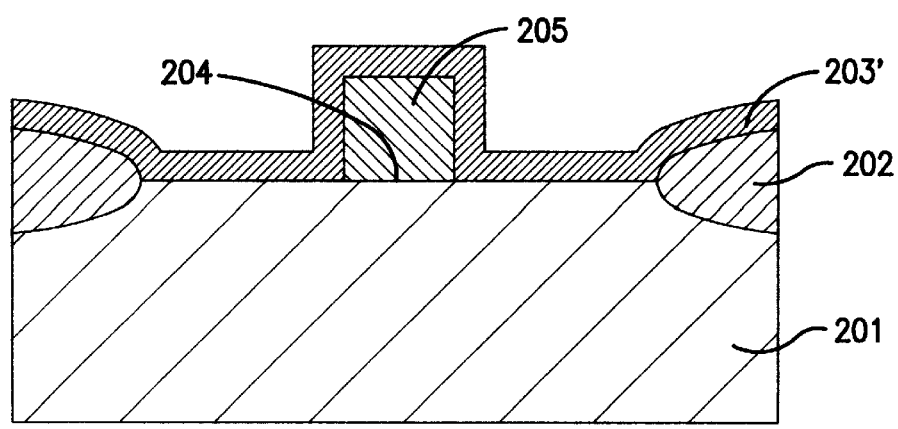

With reference to FIG. 3A, field oxide films 202 are selectively formed by a local oxidation of silicon method on a top surface of an n-type silicon substrate 201. A gate oxide film 204 having a thickness of 8 nanometers is formed on the top surface of the n-type silicon substrate 201. A polysilicon film having a thickness of 200 nanometers is deposited by a chemical vapor deposition method over the gate oxide film 204 and over the field oxide films 202. The polysilicon film is then patterned by a photolithographic technique to form a gate oxide film 204 and a gate electrode 205. A silicon oxide film 203 having a thickness of 80 nanometers is then entirely deposited by a chemical vapor deposition method over the gate electrode 205, the silicon substrate 201 and the field oxide films 202.

With reference to FIG. 3B, the silicon oxide film 203' is subjected to an etch back using an isotropic dry etching process to form gate side wall silicon oxide films 203.

With reference to FIG. 3C, silicon films 206 are selectively grown on the silicon substrate 201 and on the gate electrode 205. The selective growth of the silicon film is made as follows. The substrate is subjected to a diluted HF treatment and a rinsing by pure water for subsequent drying the same so as to remove any spontaneous oxide films over the substrate surface before the substrate is introduced into an ultrahigh vacuum chemical vapor deposition system possessing a vacuum pressure of $1\times10^{-10}$ Torr, and a growth chamber discharge rate of 500 liters/second ($N_2$ conversion). Subsequently, the substrate is then subjected to a high vacuum annealing process in a growth chamber at a temperature of 800° C. for removal of any spontaneous oxide films from the substrate surface before the substrate temperature is dropped to 650° C. for supplying $Si_2H_6$ gas at a pressure of $1\times10^{-4}$ Torr so as to grow silicon films 206 having a thickness of 50 nanometers. Thereafter, the substrate is subjected to an ion-implantation of $BF_2$ at an acceleration voltage of 30 keV and a dose of $1\times10^{15}$ /cm² for subsequent annealing in nitrogen atmosphere at a temperature of 1000° C. to activate the implanted ions thereby forming source and drain regions 208 and 207.

With reference to FIG. 3D, the substrate is then subjected to a diluted HF solution diluted 1/200 by pure water for 60 seconds to remove surface regions of the gate side wall silicon oxide films 203 whereby the thickness of the gate side wall silicon oxide films 203 is reduced to about 60 nanometers.

Figure 3E:
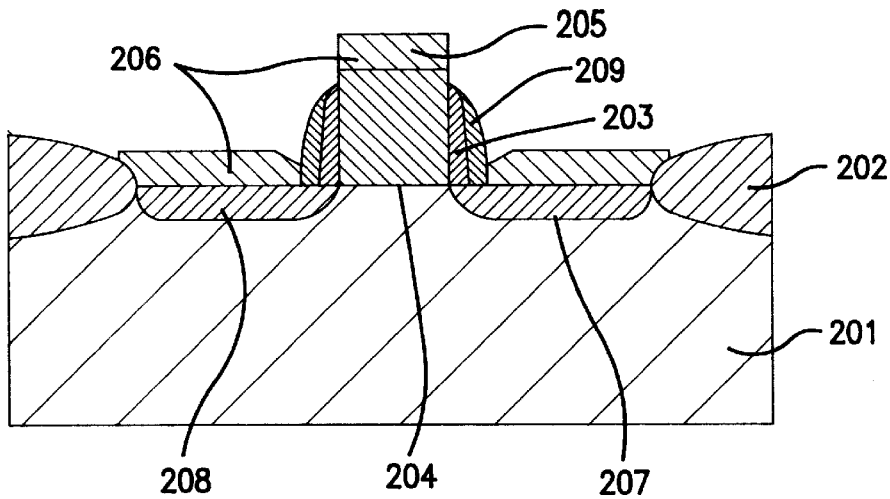

With reference to FIG. 3E, a silicon oxide film having a thickness of 20 nanometers is deposited by a chemical vapor deposition method for subsequent etch back process using an anisotropic dry etching to form secondary gate side wall silicon oxide films 209 on the gate side wall silicon oxide films 203.

Figure 3F:
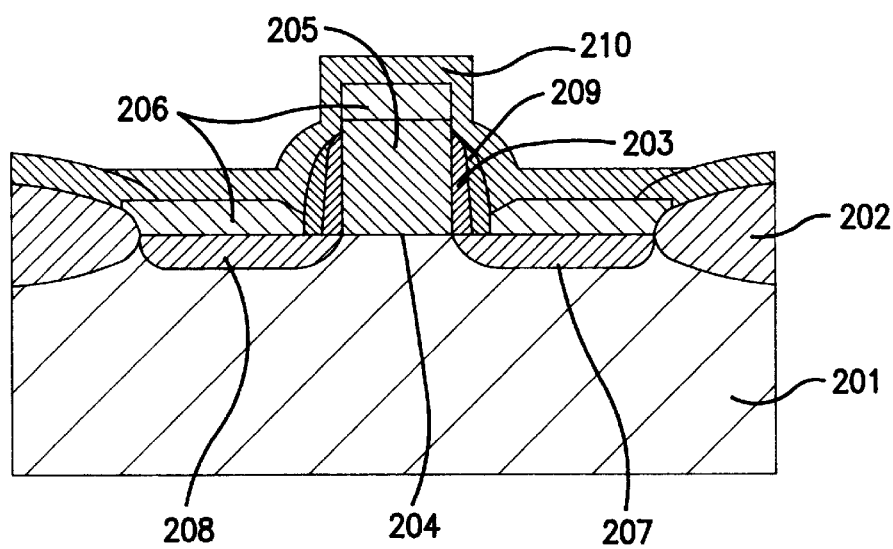

With reference to FIG. 3F, a titanium film 210 is then deposited by a sputtering method.

Figure 3G:
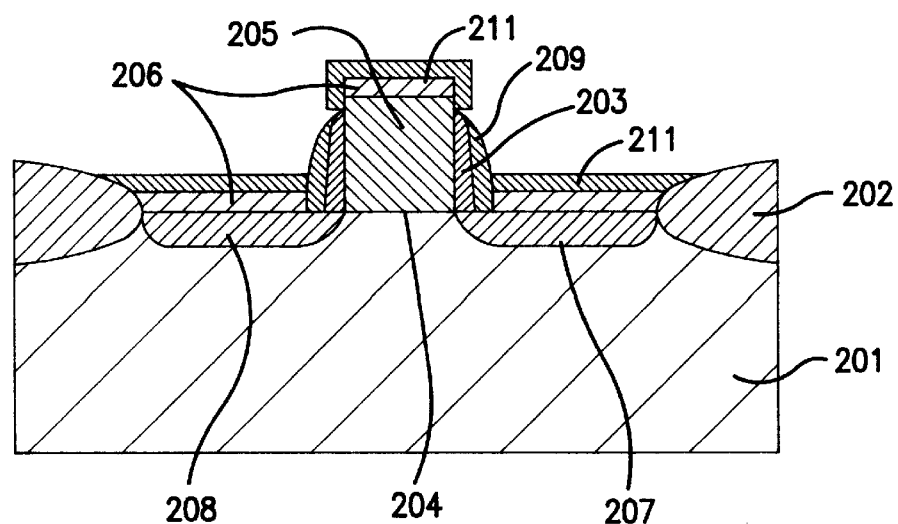

With reference to FIG. 3G, the substrate is then subjected to an annealing to cause a titanium silicidation reaction to selectively form titanium silicide films 211 on the selectively grown silicon films 206. Unreacted titanium film 210 is then removed. An inter-layer insulator and an interconnection are formed by the known processes thereby forming a MOS field effect transistor.

In the above novel method, after the gate side wall insulation films have been formed, then the silicon films are selectively grown on the silicon substrate and on the gate electrode. It is, however, possible that silicon crystal particles are formed on the gate side wall insulation films. As described above, however, the surface regions of the gate side wall insulation films are etched by a wet etching thereby any silicon crystal particles are also removed. As a result, the surfaces of the gate side wall insulation films have no silicon crystal particle. For this reason, it is possible to prevent any formation of a short circuit between the gate electrode and either the source or drain region whereby no leakage of current between the gate electrode and either the source or drain region may appear.

Whereas in this embodiment, the novel method is applied to the formation of the p-MOS field effect transistor, the novel method may of course be applied to other MOS field effect transistors of n-MOS field or CMOS type.

In place of the titanium silicide film, other metal silicide films, preferably refractory metal silicide films such as tungsten silicide film, cobalt silicide film and molybdenum silicide film are also available.

Further, in place of the ultrahigh vacuum chemical vapor deposition system, a low pressure chemical vapor deposition system is also available.

A second embodiment according to the present invention will be described in detail with reference to FIGS. 5A through 5F which show fragmentary cross sectional elevation views illustrative of MOS field effect transistors with gate side wall oxide films in sequential steps of fabrication.

Figure 5A:
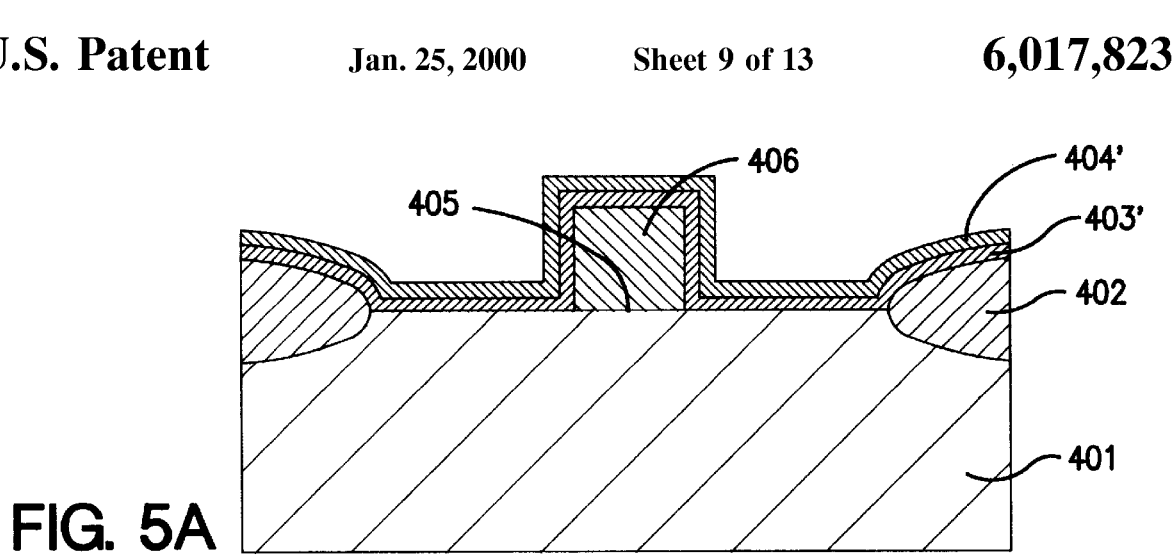
FIGS. 5A through 5F are fragmentary cross sectional elevation views illustrative of MOS field effect transistors with gate side wall oxide films in sequential steps involved in a second embodiment according to the present invention.

With reference to FIG. 5A, field oxide films 402 are selectively formed by a local oxidation of silicon method on a top surface of an n-type silicon substrate 401. A gate oxide film 405 having a thickness of 8 nanometers is formed on the top surface of the n-type silicon substrate 401. A polysilicon film having a thickness of 200 nanometers is deposited by a chemical vapor deposition method over the gate oxide film 404 and over the field oxide films 402. The polysilicon film is then patterned by a photolithographic technique to form a gate oxide film 405 and a gate electrode 406. A silicon nitride film 403' having a thickness of 40 nanometers is then deposited by a chemical vapor deposition method over the gate electrode 406, the silicon substrate 401 and the field oxide films 402. Subsequently, a silicon oxide film 404' having a thickness of 40 nanometers is then deposited by a chemical vapor deposition method over the silicon nitride film 403'.

Figure 5B:
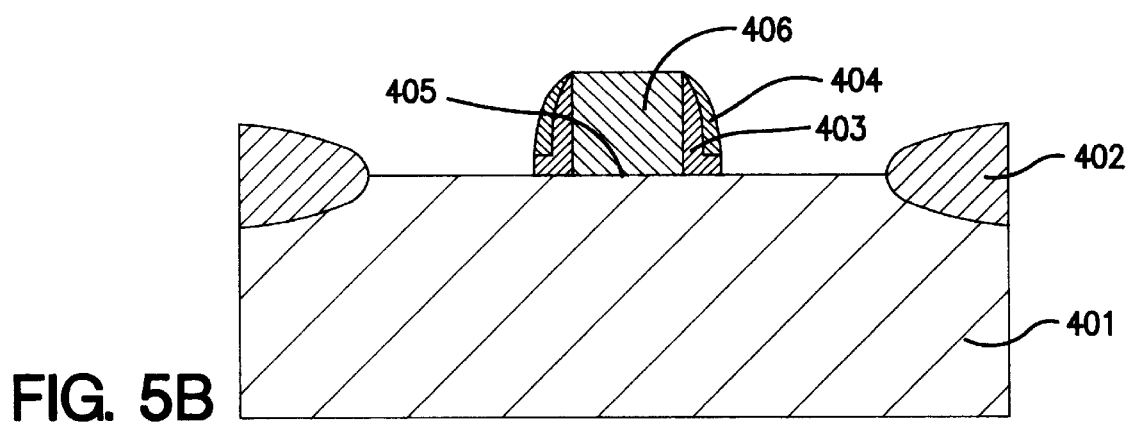

With reference to FIG. 5B, laminations of the silicon nitride film 403' and the silicon oxide film 404' are subjected to an etch back using an anisotropic dry etching process to form gate side wall silicon nitride film 403 and gate side wall silicon oxide film 404.

Figure 5C:
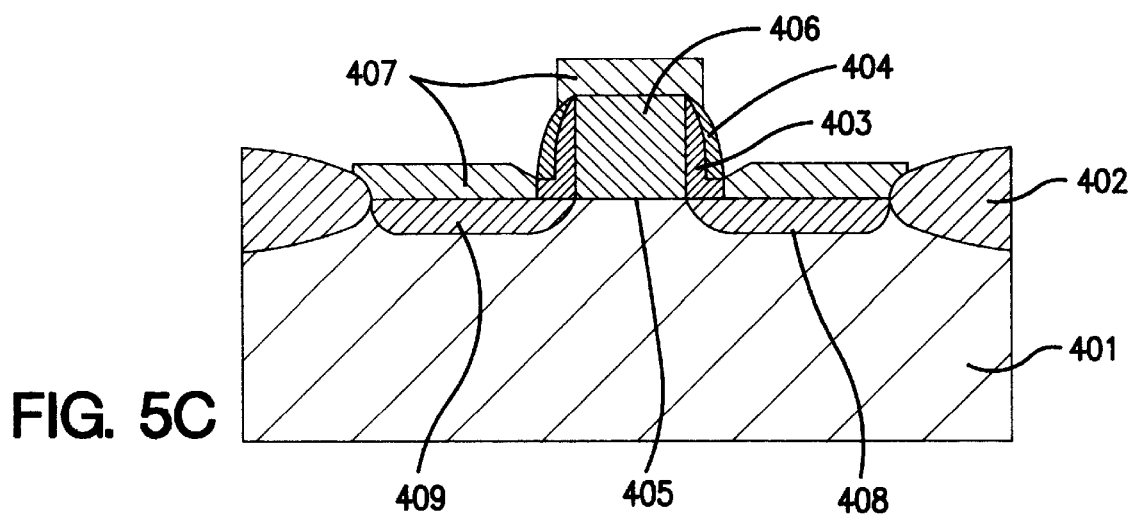

With reference to FIG. 5C, silicon films 407 are selectively grown on the silicon substrate 401 and on the gate electrode 406. The selective growth of the silicon film is made as follows. The substrate is subjected to a diluted HF treatment and a rinsing by pure water for subsequent drying to remove any spontaneous oxide films over the substrate surface before the substrate is introduced into an ultrahigh vacuum chemical vapor deposition system possessing a vacuum pressure of $1 \times 10^{-10}$ Torr, and a growth chamber discharge rate of 500 liters/second ($N_2$ conversion). Subsequently, the substrate is then subjected to a high vacuum annealing process in a growth chamber at a temperature of 800° C. for removal of any spontaneous oxide films from the substrate surface before the substrate temperature is dropped to 650° C. for supplying $Si_2H_6$ gas at a pressure of $1 \times 10^{-4}$ Torr so as to grow silicon films 407 having a thickness of 50 nanometers. Thereafter, the substrate is subjected to an ion-implantation of $BF_2$ at an acceleration voltage of 30 keV and a dose of $1 \times 10^{15}$ /cm$^2$ for subsequent annealing in nitrogen atmosphere at a temperature of 1000° C. to activate the implanted ions thereby forming source and drain regions 409 and 408.

Figure 5D:
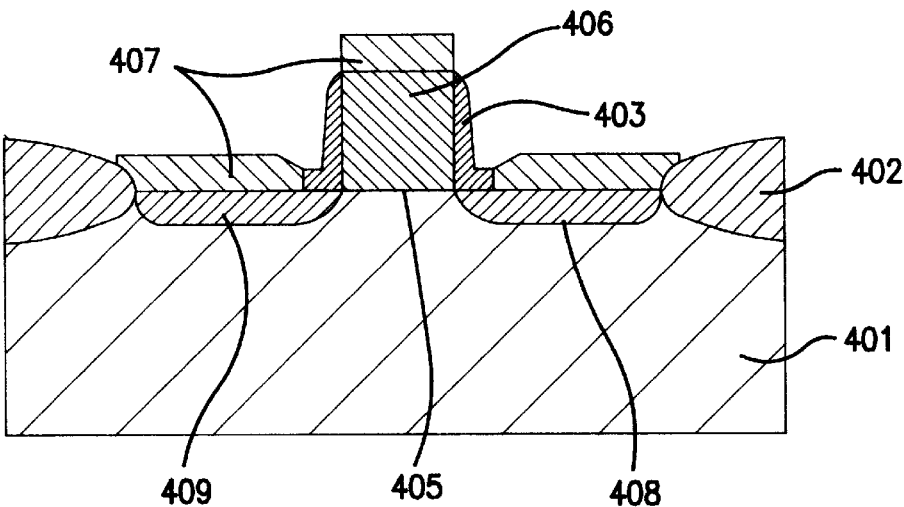

With reference to FIG. 5D, the substrate is then subject to a diluted HF solution diluted 1/200 by pure water for 150 seconds to remove the gate side wall silicon oxide films 404 and to leave the silicon nitride film 403 whereby the thickness of the gate side wall silicon nitride films is reduced to 40 nanometers.

The gate side wall insulation film initially comprises the silicon oxide film 404 laminated over the silicon nitride film 403 so that only the silicon oxide film 404 is etched by the diluted HF solution which is capable of etching the silicon oxide film but incapable of etching the silicon nitride film, for which reason only the silicon oxide film 404 is etched whilst the silicon nitride film 403 remains unremoved. This makes it easy to do highly accurate control of the thickness of the gate side wall insulation films.

Figure 5E:
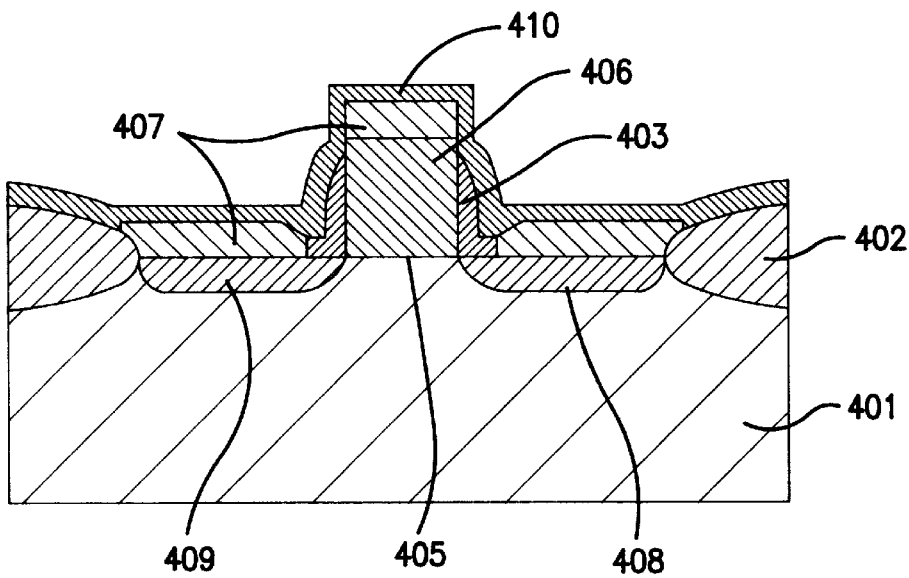
Figure 5F:
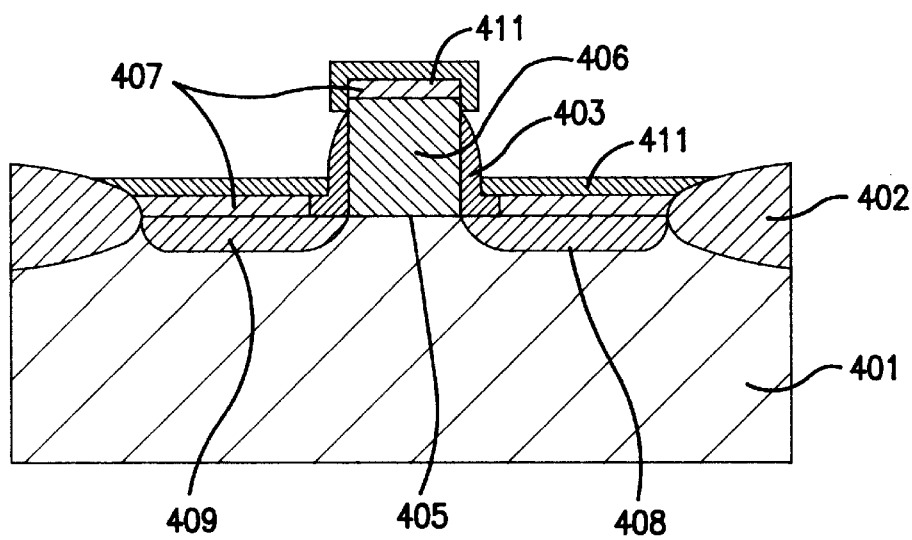

With reference to FIG. 5E, a titanium film 410 is then deposited by a sputtering method With reference to FIG. 5F, the substrate is then subjected to an annealing to cause a titanium silicidation reaction to selectively form titanium silicide films 411 on the selectively grown silicon films 406. Unreacted titanium film 410 is then removed. An inter-layer insulator and an interconnection are formed by the known processes thereby forming a MOS field effect transistor.

In the above novel method, after the gate side wall insulation films have been formed, then the silicon films are selectively grown on the silicon substrate and on the gate electrode. It is, however, possible that silicon crystal particles are formed on the gate side wall insulation films. As described previously the surface regions of the gate side wall insulation films are etched by a wet etching whereby any silicon crystal particles are also removed.

Further, the gate side wall insulation film comprises the silicon oxide film laminated over the silicon nitride film so that only the silicon oxide film is etched wherein any silicon crystal particles are also removed This etching is made using a diluted HF solution which is capable of etching the silicon oxide film but incapable of etching the silicon nitride film, for which reason only the silicon oxide film is etched whilst the silicon nitride film remains unremoved. This makes it easy to do highly accurate control of the thickness of the gate side wall insulation films.

Whereas in this embodiment, the novel method is applied to the formation of the p-MOS field effect transistor, the novel method may of course be applied to other MOS field effect transistors of n-MOS field or CMOS type.

In place of the titanium silicide film, other metal silicide films, preferably refractory metal silicide films such as tungsten silicide film, cobalt silicide film and molybdenum silicide film are also available.

Further, in place of the ultrahigh vacuum chemical vapor deposition system, a low pressure chemical vapor deposition system is also available.

A third embodiment according to the present invention will be described in detail with reference to FIGS. 6A through 6F which show fragmentary cross sectional elevation views illustrative of MOS field effect transistors with gate side wall oxide films in sequential steps of fabrication.

Figure 6A:
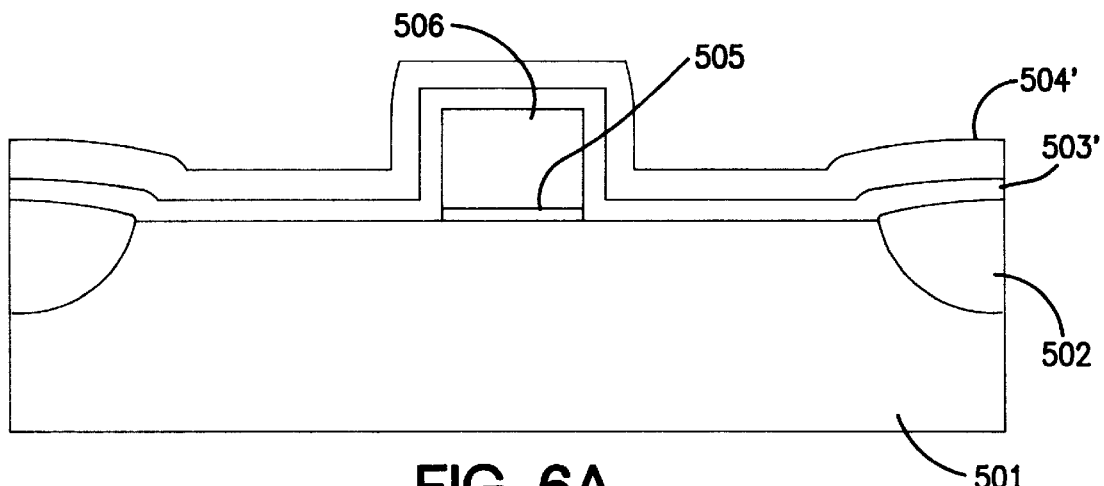
FIGS. 6A through 6G are fragmentary cross sectional elevation views illustrative of MOS field effect transistors with gate side wall oxide films in sequential steps involved in a third embodiment according to the present invention.

With reference to FIG. 6A, field oxide films 502 are selectively formed by a local oxidation of silicon method on a top surface of an n-type silicon substrate 501. A gate oxide film 505 having a thickness of 5 nanometers is formed on the top surface of the n-type silicon substrate 501. A polysilicon film having a thickness of 200 nanometers is deposited by a chemical vapor deposition method over the gate oxide film 505 and over the field oxide films 502. The polysilicon film is then patterned by a photolithographic technique to form a gate oxide film 505 and a gate electrode 506. A silicon nitride film 503 having a thickness of 40 nanometers is then deposited by a chemical vapor deposition method over the gate electrode 506, the silicon substrate 501 and the field oxide films 502. Subsequently, a silicon oxide film 504' having a thickness of 40 nanometers is then entirely deposited by a chemical vapor deposition method over the silicon nitride film 503'.

Figure 6B:
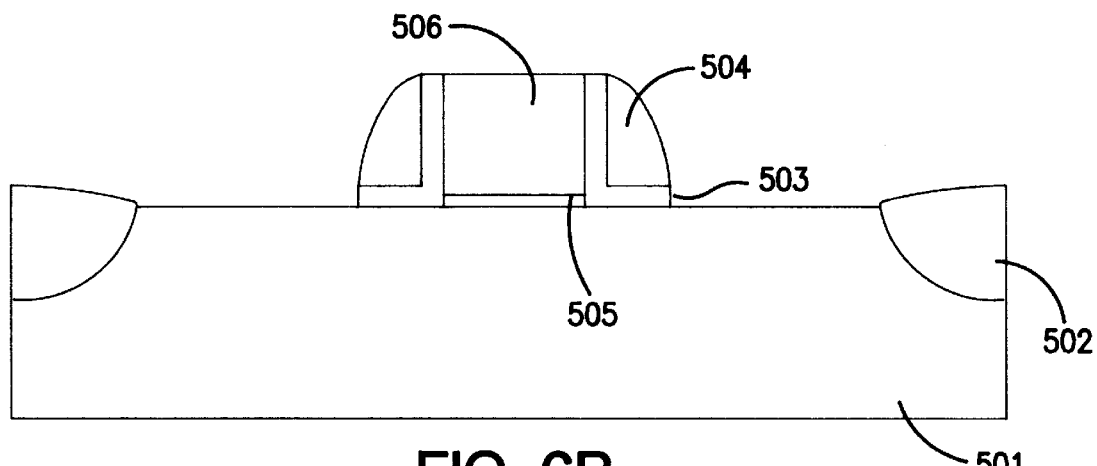
Figure 6C:
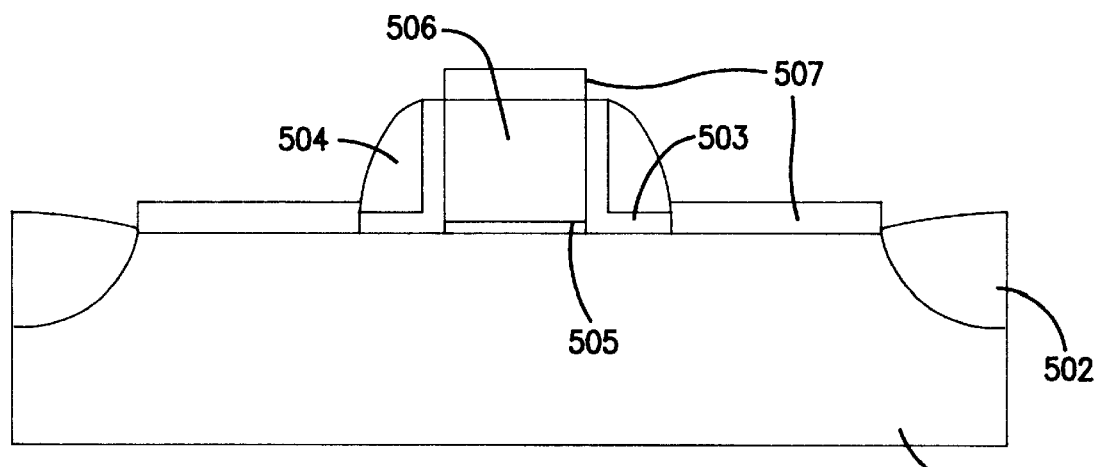

With reference to FIG. 6B, laminations of the silicon nitride film 503' and the silicon oxide film 504' are subjected to an etch back using an anisotropic dry etching process to form gate side wall nitride film 503 and gate side wall silicon oxide film 504.

With reference to FHG. 6C, silicon films 507 are selectively grown on the silicon substrate 501 and on the gate electrode 506. The selective growth of the silicon film is made as follows. The substrate is subjected to a dilated HF treatment and a rinsing by pure water for subsequent drying to remove any spontaneous oxide films over the substrate surface before the substrate is introduced into an ultrahigh vacuum chemical vapor deposition system possessing a vacuum pressure of $1 \times 10^{-10}$ Torr, and a growth chamber discharge rate of 500 liters/second ($N_2$ conversion). Subsequently, the substrate is then subjected to a high vacuum annealing process in a growth chamber at a temperature of 800° C. for removal of any spontaneous oxide films from the substrate surface before the substrate temperature is dropped to 650° C. for supplying $Si_2H_6$ gas at a pressure of $1 \times 10^{-4}$ Torr so as to grow silicon films 507 having a thickness of 50 nanometers.

Figure 6D:
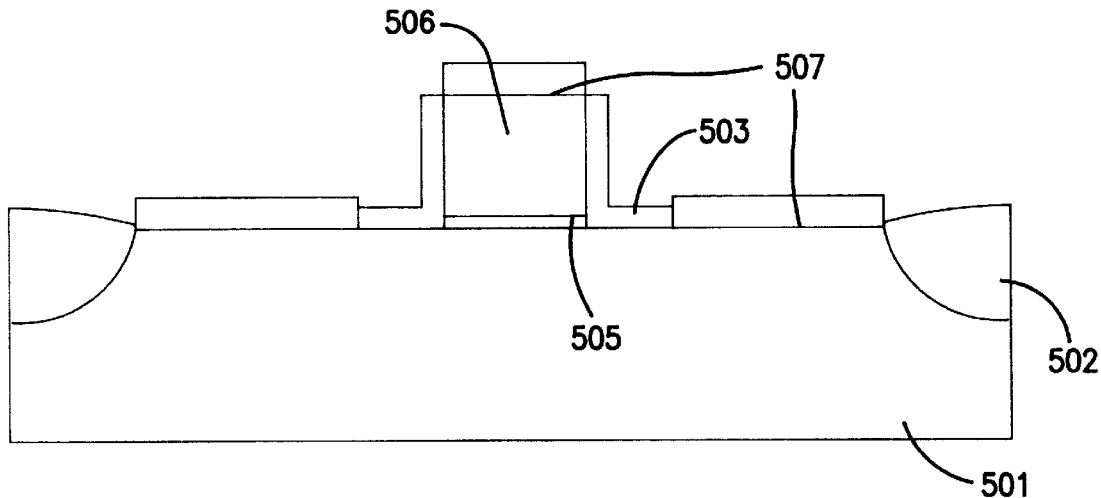

With reference to FIG. 6D, the substrate is then subjected to a diluted HF solution diluted 1/200 by pure water for 150 seconds to remove the gate side wall silicon oxide fills 504 and to leave the silicon nitride film 503 whereby the thickness of the gate side wall silicon nitride films is reduced to 40 nanometers.

The gate side wall insulation film initially comprises the silicon oxide Mm 504 laminated over the silicon nitride film 503 so that only the silicon oxide film 504 is etched by the diluted HF solution.

Figure 6E:
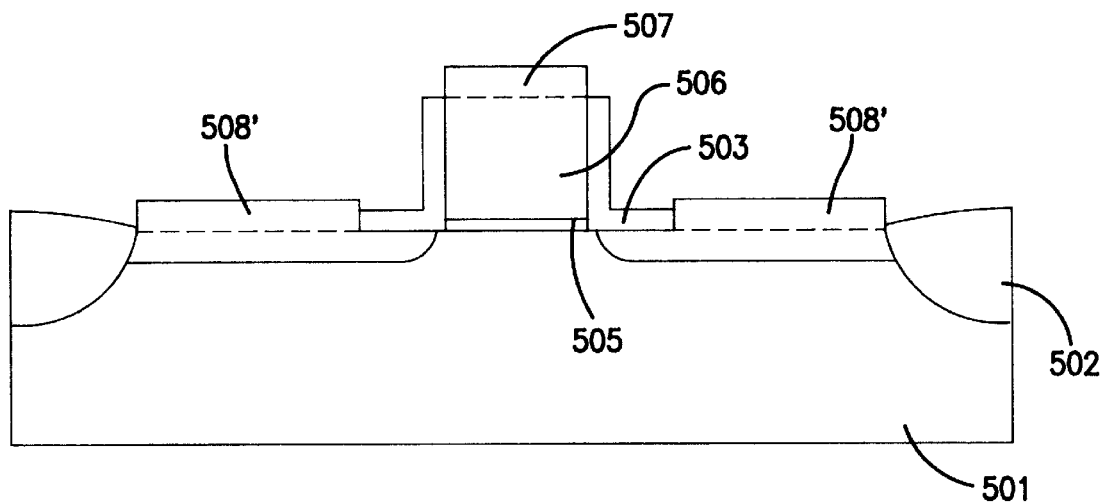
Figure 6F:
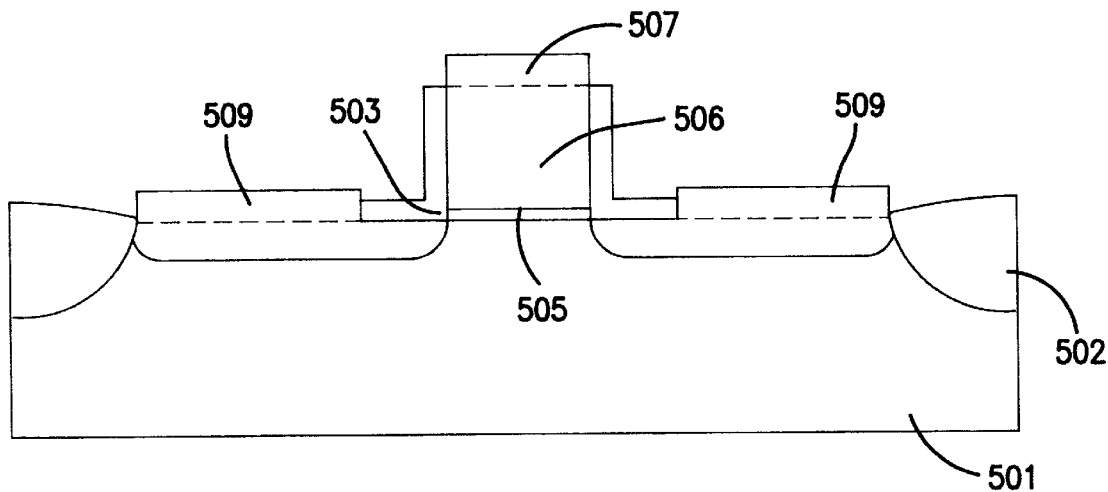
Figure 6G:
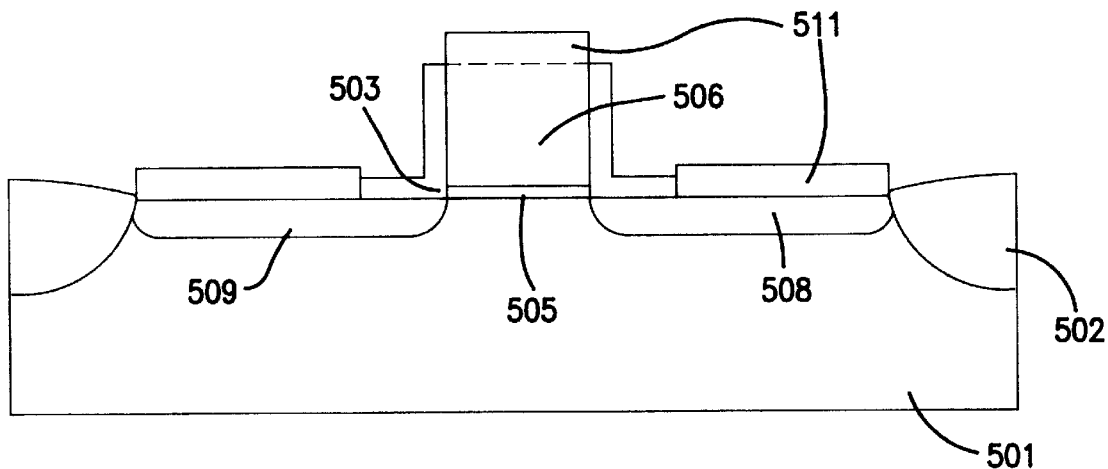

With reference to FIG. 6E, the substrate is subjected to an ion-implantation of $BF_2$ at an acceleration voltage of 20 keV and a dose of $3 \times 10^{15}/cm^2$, wherein a projected range is set at 20 nanometers so that a peak of impurity concentration is in the selectively grown silicon film 507 or in the gate side wall silicon nitride film 503. Ion range distance in single crystal silicon is longer than that in silicon nitride, for which reason the impurity implanted regions 508' have impurity depth which is almost the same as a depth of an interface between the selectively grown silicon films and the substrate. A lamp annealing process is then cased out for 10 seconds in nitrogen atmosphere at a temperature of 1000° C. to activate the implanted ions thereby forming relatively shallow source and drain regions 509 and 508 (shown in FIG. 6F) having a surface impurity concentration of $1 \times 10^{20}/cm^3$ for improvement in the driving voltage characteristic of the MOS field effect transistor. The junction depth of the shallow diffusion regions and the impurity concentration thereof may accurately be controlled by the thickness of the gate side wall silicon nitride films With reference to FIG. 6G, a sputtering method onto a heated substrate at a temperature which is sufficiently high for causing a titanium silicidation reaction to selectively form titanium silicide films 511 on the selectively grown silicon films 506. An inter-layer insulator and an interconnection are formed by the known processes thereby forming a MOS field effect transistor.

In the above novel method, after the gate side wall insulation films have been formed, then the silicon films are selectively grown on the silicon substrate and on the gate electrode. It is, however, possible silicon crystal particles are formed on the gate side wall insulation films. As described previously the surface regions of the gate side wall insulation films are etched by a wet etching thereby any silicon crystal particles are also removed.

Further, the gate side wall insulation film initially comprises a silicon oxide film laminated over the silicon nitride film so that only the silicon oxide film is etched wherein the any silicon crystal particles are also removed. This etching is made using a diluted HF solution.

Whereas in this embodiment, the novel method is applied to the formation of the p-MOS field effect transistor, the novel method may of course be applied to other MOS field effect transistors of either n-MOS CMOS types.

In place of the titanium silicide films other metal silicide films, preferably refractory metal silicide films such as tungsten silicide film, cobalt silicide film and molybdenum silicide film are also available.

Further, in place of the ultrahigh vacuum chemical vapor deposition system, a low pressure chemical vapor deposition system is also available.

Improvement in the driving voltage characteristic of the MOS field effect transistor may be obtained. Further, the junction depth of the shallow diffusion regions and the impurity concentration thereof may accurately be controlled by the thickness of the gate side wall silicon nitride films.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming gate side wall insulation spacers on side walls of a gate electrode on a gate insulation film over a silicon substrate surface, said method comprising the steps of:

selectively forming gate side wall insulation spacers on side walls of a gate electrode;

selectively growing a silicon film on at least one of a top of the gate electrode and on the silicon substrate surface; and etching surface regions of the above-formed gate side wall insulation spacers.

2. The method as claimed in claim 1, further comprising the step of forming secondary gate side wall insulation spacers on the etched surfaces of the gate side wall insulation spacers.

3. The method as claimed in claim 1, wherein the gate side wall insulation spacers comprise silicon oxide films.

4. The method as claimed in claim 3, further comprising the step of forming secondary silicon oxide spacers on the etched surfaces of the silicon oxide spacers.

5. The method as claimed in claim 1, wherein the gate side wall insulation spacers comprise a silicon oxide film on a silicon nitride film and wherein the silicon oxide film is etched whilst the silicon nitride film is not etched during the step of etching surface regions of the gate side wall spacers.

6. The method as claimed in claim 5, further comprising the step of forming a secondary silicon oxide spacer on the remaining silicon nitride spacer.

7. The method as claimed in claim 1, wherein the step of etching the surface regions of the gate side wall insulation spacers comprises wet etching.

8. The method as claimed in claim 7, wherein the wet etching step is carried out using a diluted HF solution.

9. A method of making a MOSFET, comprising the steps of:
   forming a gate electrode on a semiconductor substrate;
   forming first insulating side walls on sides of the gate electrode;
   growing a silicon film on the gate electrode and the substrate;
   ion-implanting the substrate through the silicon film;
   reducing a thickness of the first side walls by etching to expose portions of the substrate between the silicon film and the thinned first side walls and to remove portions of the silicon film inadvertently formed on the first side walls; and
   forming second insulating side walls on the thinned first side walls to cover the thinned first side walls and the exposed portions of the substrate.

10. A method of making a MOSFET, comprising the steps of:
    forming a gate electrode on a semiconductor substrate;
    forming a first insulating film on the gate electrode and the substrate;
    forming a second insulating film on the first insulating film;
    forming laminated side walls on sides of the gate electrode by etching the first and second insulating films;
    growing a silicon film on the gate electrode and the substrate;
    ion-implanting the substrate through the silicon film; and
    reducing a thickness of the side walls by etching away the second insulating film in the side walls and to remove portions of the silicon film inadvertently formed on the side walls.

11. The method of claim 10, wherein the first insulating film is a silicon nitride and the second insulating film is a silicon oxide.

* * * * *